(12) United States Patent
Horii et al.

(10) Patent No.: US 11,544,614 B2
(45) Date of Patent: Jan. 3, 2023

(54) SAMPLING OF AN OPERATOR IN A QUANTUM SYSTEM

(71) Applicant: International Business Machines Corporation, Armonk, NY (US)

(72) Inventors: Hiroshi Horii, Tokyo (JP); Hitomi Chiba, Tokyo (JP); Christopher James Wood, Long Island City, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 295 days.

(21) Appl. No.: 16/894,253

(22) Filed: Jun. 5, 2020

(65) Prior Publication Data

US 2021/0383267 A1    Dec. 9, 2021

(51) Int. Cl.
*G06N 10/00* (2022.01)
*G06F 17/18* (2006.01)

(52) U.S. Cl.
CPC .............. *G06N 10/00* (2019.01); *G06F 17/18* (2013.01)

(58) Field of Classification Search
CPC ........ G06N 10/00; G06N 7/005; G06N 10/20; G06F 17/18; G06F 30/3308; G06F 30/27
See application file for complete search history.

(56) References Cited

U.S. PATENT DOCUMENTS

| | | | |
|---|---|---|---|
| 7,113,967 B2 | 9/2006 | Cleve et al. | |
| 9,477,796 B2 | 10/2016 | Garcia-Ramirez et al. | |
| 10,332,024 B2 | 6/2019 | Scheer et al. | |
| 10,339,239 B2 | 7/2019 | Oberg et al. | |
| 10,469,087 B1* | 11/2019 | Granade | B82Y 10/00 |
| 11,295,207 B2* | 4/2022 | Wiebe | G06N 10/00 |
| 2006/0123363 A1 | 6/2006 | Williams et al. | |
| 2019/0049495 A1* | 2/2019 | Ofek | G01R 33/20 |
| 2020/0067040 A1* | 2/2020 | Kim | H01M 10/6554 |

(Continued)

FOREIGN PATENT DOCUMENTS

WO    2019125876    6/2019

OTHER PUBLICATIONS

Cui et al., "An optimal expression of a Kraus operator as a linear combination of unitary matrices," Journal of Physics A: Mathematical and Theoretical, Oct. 2012, 9 pages.

(Continued)

*Primary Examiner* — Brian D Nguyen
(74) *Attorney, Agent, or Firm* — Amin, Turocy & Watson, LLP

(57) ABSTRACT

Systems, computer-implemented methods, and computer program products to facilitate sampling of an operator in a quantum system are provided. According to an embodiment, a system can comprise a memory that stores computer executable components and a processor that executes the computer executable components stored in the memory. The computer executable components can comprise a cache component that caches a probability distribution and a quantum state of one or more Kraus operators in a quantum circuit. The computer executable components can further comprise a simulator component that simulates one or more shots of the quantum circuit based on the probability distribution and the quantum state of the one or more Kraus operators. The one or more shots are indicative of one or more algorithm execution instances.

17 Claims, 14 Drawing Sheets

(56) References Cited

U.S. PATENT DOCUMENTS

| | | | |
|---|---|---|---|
| 2020/0334107 A1* | 10/2020 | Katabarwa | G06F 11/1076 |
| 2021/0365606 A1* | 11/2021 | Yu | G06Q 50/30 |
| 2021/0374589 A1* | 12/2021 | Ma | G06N 10/00 |

OTHER PUBLICATIONS

Li et al., "SANQ: A Simulation Framework for Architecting Noisy Intermediate-Scale Quantum Computing System," arXiv:1904.11590v2, May 7, 2019, 13 pages.

Mell et al., "The NIST Definition of Cloud Computing," Recommendations of the National Institute of Standards and Technology, NIST Special Publication 800-145, Sep. 2011, 7 pages.

* cited by examiner

SAMPLING OF AN OPERATOR IN A QUANTUM SYSTEM

BACKGROUND

The subject disclosure relates to sampling in a quantum system, and more specifically, to sampling of an operator in a quantum system.

A problem with the present state of the art for simulating a quantum circuit is that sampling is not available if a circuit includes a Kraus operator to simulate multiple shots of the quantum circuit. The final state of a quantum circuit varies for each shot and a Kraus operator produces randomness for the quantum state. Existing simulators cannot use sampling optimization for quantum systems having a large number of quantum bits (e.g., 20 quantum bits (qubits)) and a density matrix simulator can use sampling, but it uses a substantial amount of memory (e.g., 16 terabytes (TB) for a 20-qubit quantum system).

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate sampling of an operator in a quantum system are described.

According to an embodiment, a system can comprise a memory that stores computer executable components and a processor that executes the computer executable components stored in the memory. The computer executable components can comprise a cache component that caches a probability distribution and a quantum state of one or more Kraus operators in a quantum circuit. The computer executable components can further comprise a simulator component that simulates one or more shots of the quantum circuit based on the probability distribution and the quantum state of the one or more Kraus operators. The one or more shots are indicative of one or more algorithm execution instances. An advantage of such a system is that it can reduce the number of shots executed in a simulation of a quantum circuit.

In some embodiments, the simulator component simulates at least one shot of the quantum circuit based on one or more probability distributions and one or more quantum states of at least one Kraus operator in the quantum circuit to reduce a number of shots executed in a simulation of the quantum circuit, thereby facilitating at least one of reduced computational costs or improved performance of at least one of the simulator component, the processor, or the system. An advantage of such a system is that it can reduce the number of shots executed in a simulation of a quantum circuit and thereby facilitate reduced computational costs and/or improved performance of a system (e.g., a quantum simulation system) and/or a processor that performs such simulation.

According to another embodiment, a computer-implemented method can comprise caching, by a system operatively coupled to a processor, a probability distribution and a quantum state of one or more Kraus operators in a quantum circuit. The computer-implemented method can further comprise simulating, by the system, one or more shots of the quantum circuit based on the probability distribution and the quantum state of the one or more Kraus operators. The one or more shots are indicative of one or more algorithm execution instances. An advantage of such a computer-implemented method is that it can be implemented to reduce the number of shots executed in a simulation of a quantum circuit.

In some embodiments, the above computer-implemented method can further comprise simulating, by the system, at least one shot of the quantum circuit based on one or more probability distributions and one or more quantum states of at least one Kraus operator in the quantum circuit to reduce a number of shots executed in a simulation of the quantum circuit, thereby facilitating at least one of reduced computational costs or improved performance of at least one of the processor or the system. An advantage of such a computer-implemented method is that it can be implemented to reduce the number of shots executed in a simulation of a quantum circuit and thereby facilitate reduced computational costs and/or improved performance of a system (e.g., a quantum simulation system) and/or a processor that performs such simulation.

According to another embodiment, a computer program product facilitating a sampling process of an operator in a quantum system is provided. The computer program product comprising a computer readable storage medium having program instructions embodied therewith, the program instructions executable by a processor to cause the processor to cache, by the processor, a probability distribution and a quantum state of one or more Kraus operators in a quantum circuit. The program instructions are further executable by the processor to cause the processor to simulate, by the processor, one or more shots of the quantum circuit based on the probability distribution and the quantum state of the one or more Kraus operators. The one or more shots are indicative of one or more algorithm execution instances. An advantage of such a computer program product is that it can reduce the number of shots executed in a simulation of a quantum circuit.

In some embodiments, the program instructions are further executable by the processor to cause the processor to obtain, by the processor, a sample of a shot comprising a defined number of Kraus operators having a corresponding random sample value within the probability distribution. An advantage of such a computer program product is that it can reduce the number of shots executed in a simulation of a quantum circuit and thereby facilitate reduced computational costs and/or improved performance of a system (e.g., a quantum simulation system) and/or a processor that performs such simulation.

DETAILED DESCRIPTION

Figure 1:
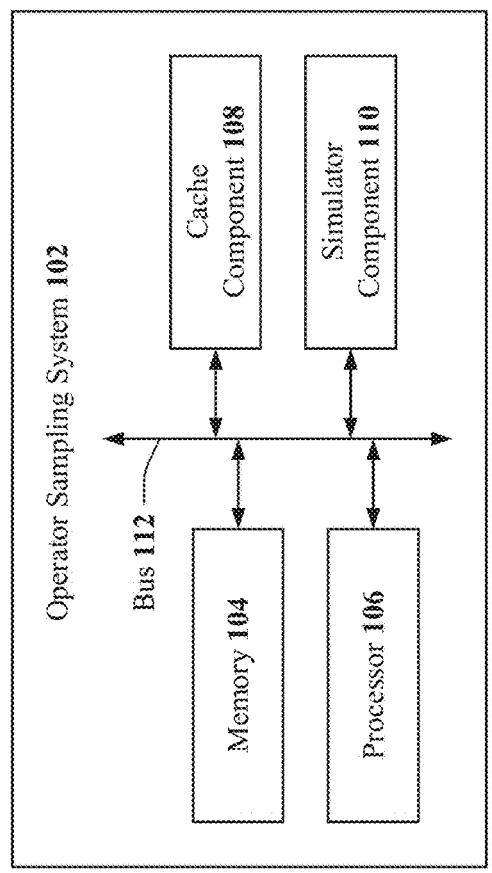
FIGS. 1-9 illustrate block diagrams of example, non-limiting systems that can facilitate sampling of an operator in a quantum system in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, can entangle multiple quantum bits, and use interference.

Given the problems described above with the present state of the art for simulating a quantum circuit, the present disclosure can be implemented to produce a solution to these problems in the form of systems, computer-implemented methods, and/or computer program products that can facilitate caching a probability distribution and a quantum state of one or more Kraus operators in a quantum circuit; and/or simulating one or more shots of the quantum circuit based on the probability distribution and the quantum state of the one or more Kraus operators, where the one or more shots are indicative of one or more algorithm execution instances. An advantage of such systems, computer-implemented methods, and/or computer program products is that they can be implemented to reduce the number of shots executed in a simulation of a quantum circuit.

In some embodiments, the present disclosure can be implemented to produce a solution to the problems described above in the form of systems, computer-implemented methods, and/or computer program products that can facilitate simulating at least one shot of the quantum circuit based on one or more probability distributions and one or more quantum states of at least one Kraus operator in the quantum circuit to reduce a number of shots executed in a simulation of the quantum circuit, thereby facilitating at least one of reduced computational costs or improved performance of at least one of the processor or the system. An advantage of such systems, computer-implemented methods, and/or computer program products is that they can be implemented to reduce the number of shots executed in a simulation of a quantum circuit and thereby facilitate reduced computational costs and/or improved performance of a system (e.g., a quantum simulation system) and/or a processor that performs such simulation.

Figure 2:
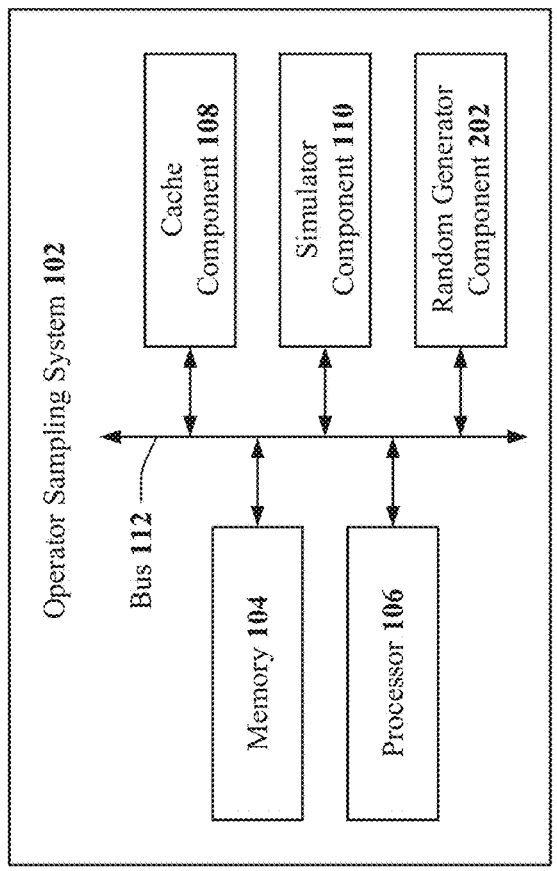

FIGS. 1 and 2 illustrate block diagrams of example, non-limiting systems 100 and 200, respectively, that can facilitate sampling of an operator in a quantum system in accordance with one or more embodiments described herein. System 100 and/or 200 can comprise an operator sampling system 102, which can be associated with a cloud computing environment. For example, operator sampling system 102 can be associated with cloud computing environment 1350 described below with reference to FIG. 13 and/or one or more functional abstraction layers described below with reference to FIG. 14 (e.g., hardware and software layer 1460, virtualization layer 1470, management layer 1480, and/or workloads layer 1490).

Operator sampling system 102 and/or components thereof (e.g., cache component 108, simulator component 110, random generator component 202, etc.) can employ one or more computing resources of cloud computing environment 1350 described below with reference to FIG. 13 and/or one or more functional abstraction layers (e.g., quantum software, etc.) described below with reference to FIG. 14 to execute one or more operations in accordance with one or more embodiments of the subject disclosure described herein. For example, cloud computing environment 1350 and/or such one or more functional abstraction layers can comprise one or more classical computing devices (e.g., classical computer, classical processor, virtual machine, server, etc.), quantum hardware, and/or quantum software (e.g., quantum computing device, quantum computer, quantum processor, quantum circuit simulation software, superconducting circuit, etc.) that can be employed by operator sampling system 102 and/or components thereof to execute one or more operations in accordance with one or more embodiments of the subject disclosure described herein. For instance, operator sampling system 102 and/or components thereof can employ such one or more classical and/or quantum computing resources to execute one or more classical and/or quantum: mathematical function, calculation, and/or equation; computing and/or processing script; algorithm; model (e.g., artificial intelligence (AI) model, machine learning (ML) model, etc.); and/or another operation in accordance with one or more embodiments of the subject disclosure described herein.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

As illustrated in FIGS. 1 and 2, operator sampling system 102 can comprise a memory 104, a processor 106, a cache component 108, a simulator component 110, and/or a bus 112. As illustrated in FIG. 2, operator sampling system 102 can further comprise a random generator component 202.

It should be appreciated that the embodiments of the subject disclosure depicted in various figures disclosed herein are for illustration only, and as such, the architecture of such embodiments are not limited to the systems, devices, and/or components depicted therein. For example, in some embodiments, system 100, system 200, and/or operator sampling system 102 can further comprise various computer and/or computing-based elements described herein with reference to operating environment 1200 and FIG. 12. In several embodiments, such computer and/or computing-based elements can be used in connection with implementing one or more of the systems, devices, components, and/or computer-implemented operations shown and described in connection with FIG. 1, FIG. 2, and/or other figures disclosed herein.

Memory 104 can store one or more computer and/or machine readable, writable, and/or executable components and/or instructions that, when executed by processor 106 (e.g., a classical processor, a quantum processor, etc.), can facilitate performance of operations defined by the executable component(s) and/or instruction(s). For example, memory 104 can store computer and/or machine readable, writable, and/or executable components and/or instructions that, when executed by processor 106, can facilitate execution of the various functions described herein relating to operator sampling system 102, cache component 108, simulator component 110, and/or another component associated with operator sampling system 102 (e.g., random generator component 202), as described herein with or without reference to the various figures of the subject disclosure.

Memory 104 can comprise volatile memory (e.g., random access memory (RAM), static RAM (SRAM), dynamic RAM (DRAM), etc.) and/or non-volatile memory (e.g., read only memory (ROM), programmable ROM (PROM), electrically programmable ROM (EPROM), electrically erasable programmable ROM (EEPROM), etc.) that can employ one or more memory architectures. Further examples of memory 104 are described below with reference to system memory 1216 and FIG. 12. Such examples of memory 104 can be employed to implement any embodiments of the subject disclosure.

Processor 106 can comprise one or more types of processors and/or electronic circuitry (e.g., a classical processor, a quantum processor, etc.) that can implement one or more computer and/or machine readable, writable, and/or executable components and/or instructions that can be stored on memory 104. For example, processor 106 can perform various operations that can be specified by such computer and/or machine readable, writable, and/or executable components and/or instructions including, but not limited to, logic, control, input/output (I/O), arithmetic, and/or the like. In some embodiments, processor 106 can comprise one or more central processing unit, multi-core processor, microprocessor, dual microprocessors, microcontroller, System on a Chip (SOC), array processor, vector processor, quantum processor, and/or another type of processor. Further examples of processor 106 are described below with reference to processing unit 1214 and FIG. 12. Such examples of processor 106 can be employed to implement any embodiments of the subject disclosure.

Operator sampling system 102, memory 104, processor 106, cache component 108, simulator component 110, and/or another component of operator sampling system 102 as described herein (e.g., random generator component 202) can be communicatively, electrically, operatively, and/or optically coupled to one another via a bus 112 to perform functions of system 100, system 200, operator sampling system 102, and/or any components coupled therewith. Bus 112 can comprise one or more memory bus, memory controller, peripheral bus, external bus, local bus, a quantum bus, and/or another type of bus that can employ various bus architectures. Further examples of bus 112 are described below with reference to system bus 1218 and FIG. 12. Such examples of bus 112 can be employed to implement any embodiments of the subject disclosure.

Operator sampling system 102 can comprise any type of component, machine, device, facility, apparatus, and/or instrument that comprises a processor and/or can be capable of effective and/or operative communication with a wired and/or wireless network. All such embodiments are envisioned. For example, operator sampling system 102 can comprise a server device, a computing device, a general-purpose computer, a special-purpose computer, a quantum computing device (e.g., a quantum computer), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

Operator sampling system 102 can be coupled (e.g., communicatively, electrically, operatively, optically, etc.) to one or more external systems, sources, and/or devices (e.g., classical and/or quantum computing devices, communication devices, etc.) via a data cable (e.g., High-Definition Multimedia Interface (HDMI), recommended standard (RS) 232, Ethernet cable, etc.). In some embodiments, operator sampling system 102 can be coupled (e.g., communicatively, electrically, operatively, optically, etc.) to one or more external systems, sources, and/or devices (e.g., classical and/or quantum computing devices, communication devices, etc.) via a network.

In some embodiments, such a network can comprise wired and wireless networks, including, but not limited to, a cellular network, a wide area network (WAN) (e.g., the Internet) or a local area network (LAN). For example, operator sampling system 102 can communicate with one or more external systems, sources, and/or devices, for instance, computing devices (and vice versa) using virtually any desired wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. In such an example, operator sampling system 102 can thus include hardware (e.g., a central processing unit (CPU), a transceiver, a decoder, quantum hardware, a quantum processor, etc.), software (e.g., a set of threads, a set of processes, software in execution, quantum pulse schedule, quantum circuit, quantum gates, etc.) or a combination of hardware and software that facilitates communicating information between operator sampling system 102 and external systems, sources, and/or devices (e.g., computing devices, communication devices, etc.).

Operator sampling system 102 can comprise one or more computer and/or machine readable, writable, and/or executable components and/or instructions that, when executed by processor 106 (e.g., a classical processor, a quantum processor, etc.), can facilitate performance of operations defined by such component(s) and/or instruction(s). Further, in numerous embodiments, any component associated with operator sampling system 102, as described herein with or without reference to the various figures of the subject disclosure, can comprise one or more computer and/or machine readable, writable, and/or executable components and/or instructions that, when executed by processor 106, can facilitate performance of operations defined by such component(s) and/or instruction(s). For example, cache component 108, simulator component 110, and/or any other components associated with operator sampling system 102 as disclosed herein (e.g., communicatively, electronically, operatively, and/or optically coupled with and/or employed by operator sampling system 102), can comprise such computer and/or machine readable, writable, and/or executable component(s) and/or instruction(s). Consequently, according to numerous embodiments, operator sampling system 102 and/or any components associated therewith as disclosed herein, can employ processor 106 to execute such computer and/or machine readable, writable, and/or executable component(s) and/or instruction(s) to facilitate performance of one or more operations described herein with reference to operator sampling system 102 and/or any such components associated therewith.

Operator sampling system 102 can facilitate (e.g., via processor 106) performance of operations executed by and/or associated with one or more components thereof (e.g., cache component 108, simulator component 110, random generator component 202, etc.). For example, operator sampling system 102 can facilitate (e.g., via processor 106): caching a probability distribution and a quantum state of one or more Kraus operators in a quantum circuit; and/or simulating one or more shots of the quantum circuit based on the probability distribution and the quantum state of the one or more Kraus operators, where the one or more shots are indicative of one or more algorithm execution instances.

In another example, as described in detail below, operator sampling system 102 can further facilitate (e.g., via processor 106): generating at least one random sample value corresponding to the one or more Kraus operators in the one or more shots of the quantum circuit; simulating at least one shot of the quantum circuit based on at least one random sample value corresponding to the one or more Kraus operators to obtain the probability distribution and the quantum state; associating at least one of the probability distribution or the quantum state with the one or more Kraus operators; obtaining a sample of a shot comprising a defined number of Kraus operators having a corresponding random sample value within the probability distribution; and/or simulating at least one shot of the quantum circuit based on one or more probability distributions and one or more quantum states of at least one Kraus operator in the quantum circuit to reduce a number of shots executed in a simulation of the quantum circuit, thereby facilitating at least one of reduced computational costs or improved performance of at least one of a processor or a system that performs such simulation. In the above examples, the one or more shots can comprise at least one not sampled shot that can comprise a defined number of Kraus operators having a corresponding random sample value within the probability distribution.

To facilitate performance of one or more of such operations described above in accordance with one or more embodiments of the subject disclosure, operator sampling system 102 (e.g., via processor 106, cache component 108, and/or simulator component 110) can implement the example, non-limiting sequence of operations described below with reference to FIGS. 3-9. Such an example, non-limiting sequence of operations described below with reference to FIGS. 3-9 can comprise one or more example, non-limiting embodiments of the subject disclosure. It should be appreciated that such an example, non-limiting sequence of operations and/or such one or more example, non-limiting embodiments of the subject disclosure described below with reference to FIGS. 3-9 are intended for illustrative purposes only and the subject disclosure is not so limiting.

FIGS. 3-9 illustrate block diagrams of example, non-limiting systems 300, 400, 500, 600, 700, 800, and 900, respectively, that can facilitate sampling of an operator in a quantum system in accordance with one or more embodiments described herein. Repetitive description of like elements and/or processes employed in respective embodiments is omitted for sake of brevity.

Figure 3:
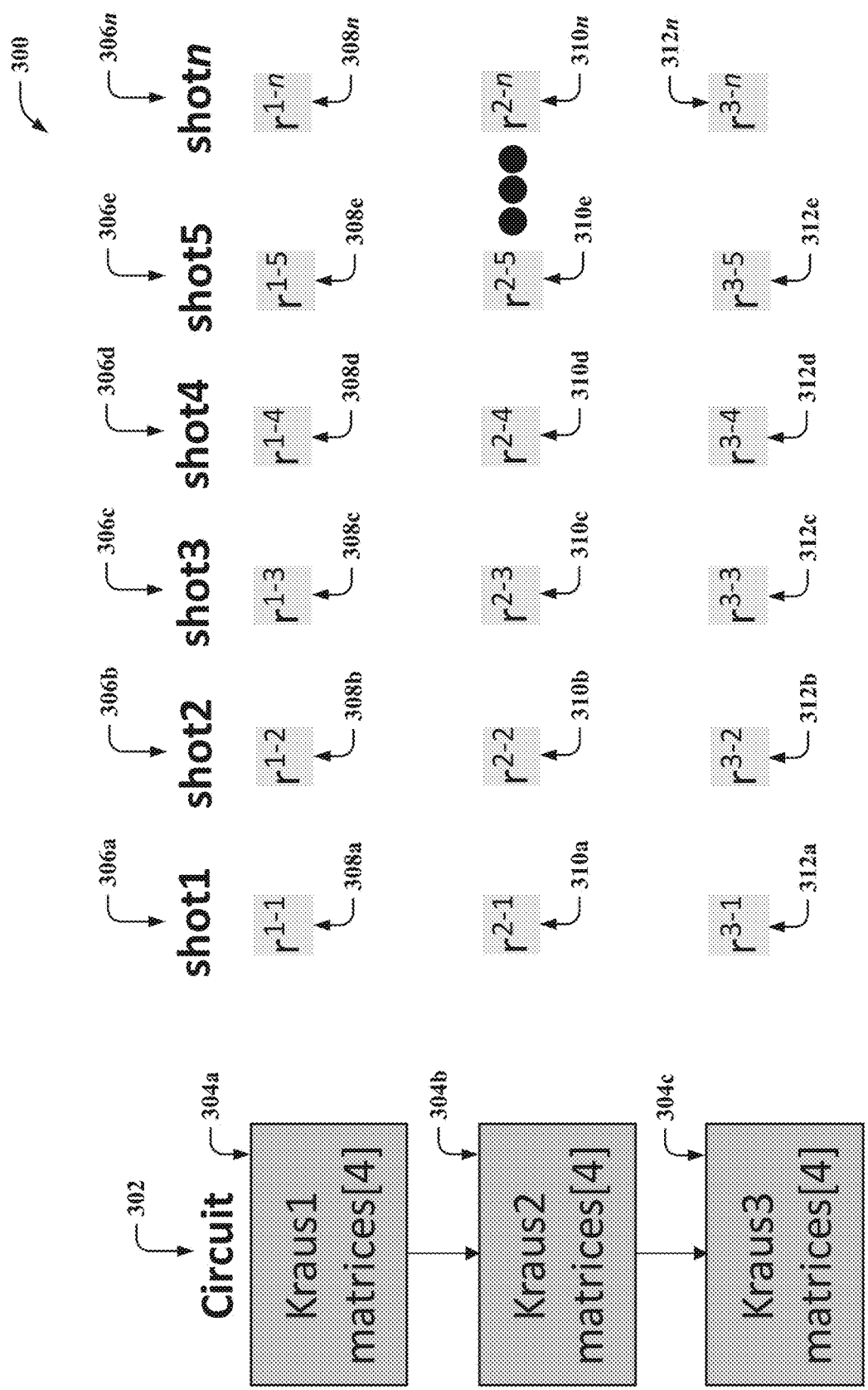

System 300 depicted in FIG. 3 can comprise an illustration of an example quantum system (e.g., a superconducting system) that can comprise a quantum circuit 302 (denoted as Circuit in FIG. 3). Quantum circuit 302 can comprise an algorithm (e.g., a quantum-based algorithm) that can comprise one or more operators 304a, 304b, and/or 304c (denoted as Kraus 1, Kraus2, and Kraus3, respectively, in FIG. 3). Although operators 304a, 304b, 304c are depicted in FIG. 3 as Kraus operators, it should be appreciated that such operators 304a, 304b, 304c can comprise one or more other operators such as, for instance, conditional operators. When executed, operators 304a, 304b, 304c can respectively yield a probability distribution and/or a quantum state associated with quantum circuit 302 and/or with one or more quantum bits (qubits) of quantum circuit 302. In the example embodiment illustrated in FIG. 3, execution of quantum circuit 302 and/or operators 304a, 304b, 304c is depicted as one or more shots 306a, 306b, 306c, 306d, 306e, and/or 306n (denoted as shot1, shot2, shot3, shot4, shot5, and shotn, respectively, in FIG. 3, where n represents a total quantity of shots). As referenced herein, a shot can denote a single algorithm execution instance that can yield a probability range (also referred to herein as a probability distribution or a probability amplitude) associated with a result.

Random generator component 202 can generate at least one random sample value corresponding to one or more operators (e.g., one or more Kraus operators) in one or more shots of a quantum circuit. For example, as illustrated by the example embodiment depicted in FIG. 3, random generator component 202 can generate a random sample value corresponding to each operator 304a, 304b, and 304c in each shot 306a, 306b, 306c, 306d, 306e, and/or 306n of quantum circuit 302.

As illustrated by the example embodiment depicted in FIG. 3, random generator component 202 can generate random sample values 308a, 308b, 308c, 308d, 308e, and/or 308n (denoted as $r^{1-1}$, $r^{1-2}$, $r^{1-3}$, $r^{1-4}$, $r^{1-5}$, and $r^{1-n}$, respectively, in FIG. 3, where n represents a total quantity of random sample values). In this example, random sample values 308a, 308b, 308c, 308d, 308e, and/or 308n correspond respectively to operator 304a in each of shots 306a, 306b, 306c, 306d, 306e, and/or 306n, as depicted in FIG. 3.

As illustrated by the example embodiment depicted in FIG. 3, random generator component 202 can generate random sample values 310a, 310b, 310c, 310d, 310e, and/or 310n (denoted as $r^{2-1}$, $r^{2-2}$, $r^{2-3}$, $r^{2-4}$, $r^{2-5}$, and $r^{2-n}$, respectively, in FIG. 3, where n represents a total quantity of random sample values). In this example, random sample values 310a, 310b, 310c, 310d, 310e, and/or 310n correspond respectively to operator 304b in each of shots 306a, 306b, 306c, 306d, 306e, and/or 306n, as depicted in FIG. 3.

As illustrated by the example embodiment depicted in FIG. 3, random generator component 202 can generate random sample values 312a, 312b, 312c, 312d, 312e, and/or 312n (denoted as $r^{3-1}$, $r^{3-2}$, $r^{3-3}$, $r^{3-4}$, $r^{3-5}$, and $r^{3-n}$, respectively, in FIG. 3, where n represents a total quantity of random sample values). In this example, random sample values 312a, 312b, 312c, 312d, 312e, and/or 312n correspond respectively to operator 304c in each of shots 306a, 306b, 306c, 306d, 306e, and/or 306n, as depicted in FIG. 3.

The random sample values described above (e.g., random sample values 308a-308n, 310a-310n, and/or 312a-312n) can comprise a numerical value between 0 and 1. To generate such random sample values described above, random generator component 202 can implement (e.g., execute via processor 106) the script defined below. In some embodiments, random generator component 202 can comprise a random number generator that can generate (e.g., by implementing (e.g., via processor 106) the script defined below) a random numerical value between 0 and 1.

Script to Generate Random Sample Values

```
vector<vector<double>> shot2rands;
for (int i = 0; i < shots; ++i) {
    vector<double> rands;
    for (int j = 0; j < num_of_kraus; ++j)
        rands.push_back(rng.next(.0, 1.));
    shot2rands.push_back(rands);
}
```

In an example embodiment, random generator component 202 can further sort lists for all shots 306a, 306b, 306c, 306d, 306e, and 306n. To sort lists for all shots 306a, 306b, 306c, 306d, 306e, and 306n, random generator component 202 can implement (e.g., execute via processor 106) the script defined below.

Script to Sort Lists for All Shots

```
sort (shot2rands);
```

Figure 4:
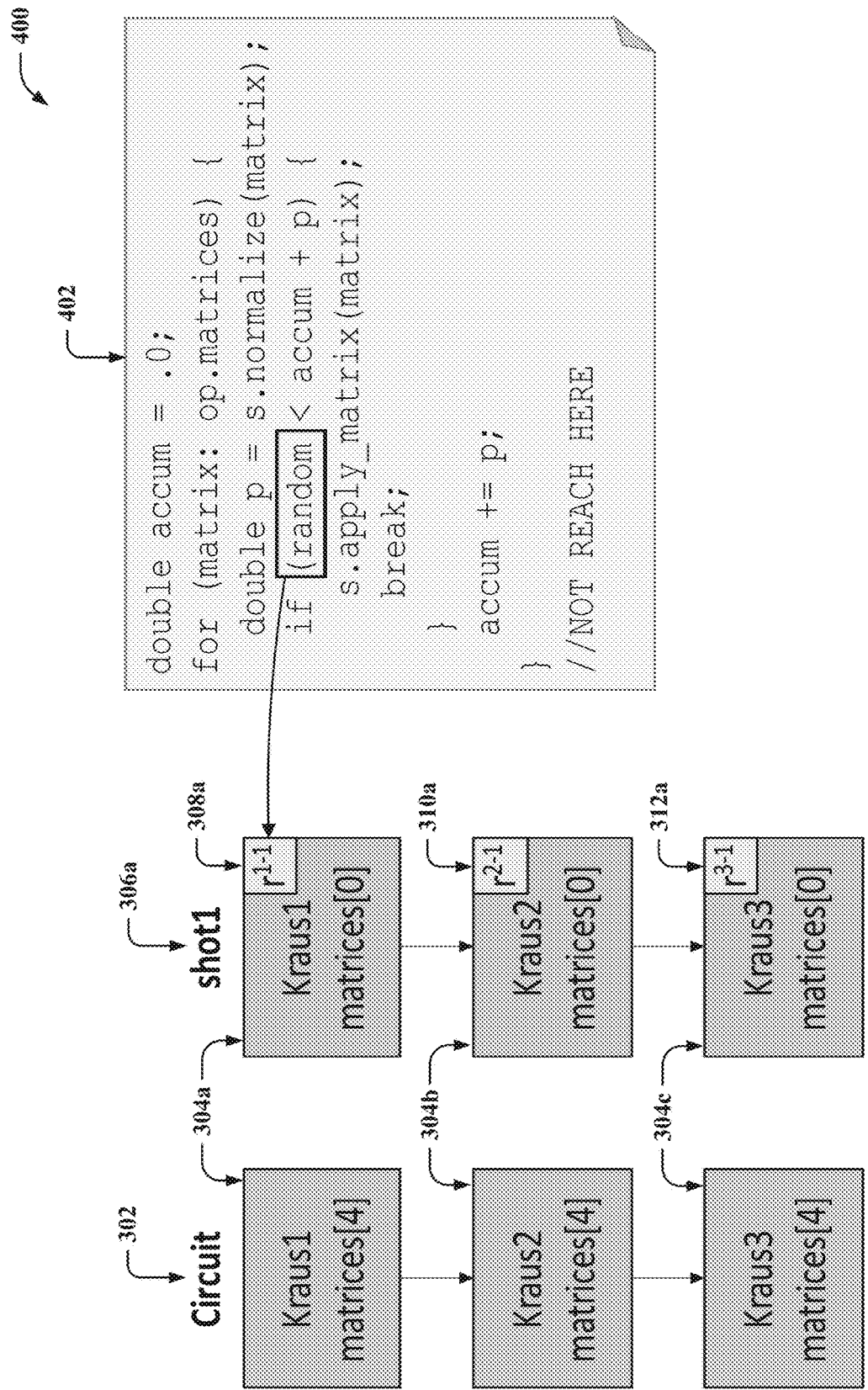

System 400 depicted in FIG. 4 can comprise an example, non-limiting alternative embodiment of system 300. In an example embodiment, system 400 depicts a simulation of a shot in quantum circuit 302. For example, as illustrated in FIG. 4, system 400 depicts a simulation of shot 306a comprising operators 304a, 304b, and 304c, where each operator 304a, 304b, and 304c can be executed by, for instance, simulator component 110 using random sample values 308a, 310a, and 312a, respectively.

Simulator component 110 can comprise a quantum simulator device (e.g., a computing device) and/or a quantum simulator application (e.g., software) that can simulate execution of a quantum circuit (e.g., execution of one or more quantum algorithms, quantum operators, quantum gates, etc.). For example, simulator component 110 can comprise a quantum simulator device and/or application including, but not limited to, a quantum simulator, a quantum computing simulator, a quantum computer, a quantum simulator application (e.g., quantum simulator software), a special purpose computer and/or application (e.g., software), a classical computer that can execute a quantum simulator application (e.g., quantum simulator software), and/or another quantum simulator device and/or application.

To simulate shot 306a using random sample values 308a, 310a, and 312a as described above, simulator component 110 can implement (e.g., execute via processor 106) the script defined below to obtain a list of random sample values (e.g., random sample values 308a, 310a, and 312a) for operators 304a, 304b, and 304c, where such a list of random sample values can be generated and/or sorted by random generator component 202 as described above.

| Script to Obtain a List of Random Sample Values |
|---|
| vector<double> caches;<br>shot = 0;<br>for (vector<double> rands: shot2rands) { |

To simulate shot 306a using random sample values 308a, 310a, and 312a as described above, simulator component 110 can further implement (e.g., execute via processor 106) script 402 illustrated in FIG. 4. Based on such simulation of shot 306a using random sample values 308a, 310a, and 312 as described above, simulator component 110 can thereby facilitate generation of a probability distribution (also referred to herein as a probability range or a probability amplitude) and/or a quantum state corresponding respectively to each of operators 304a, 304b, and 304c as described below.

Figure 5:
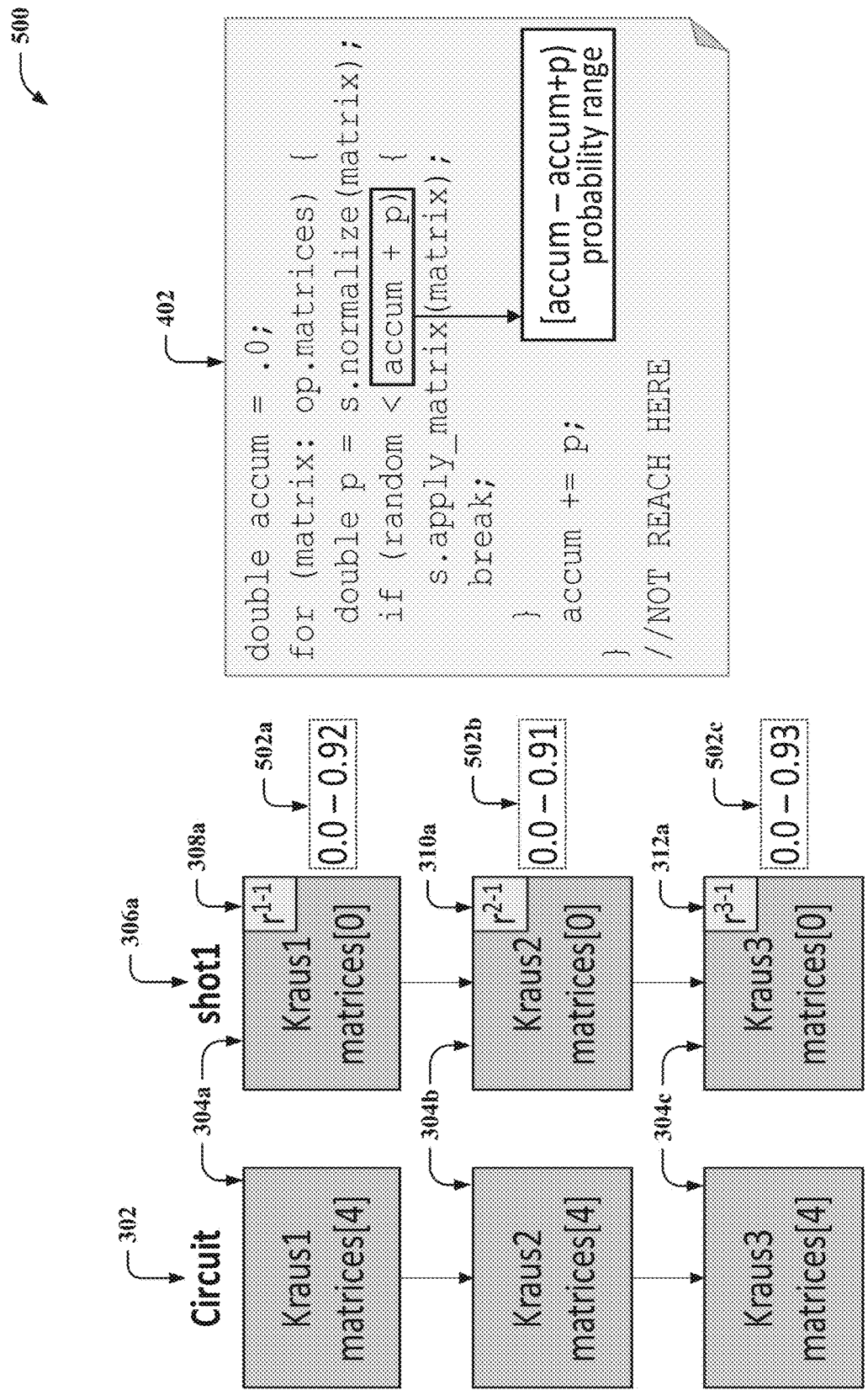

System 500 depicted in FIG. 5 can comprise an example, non-limiting alternative embodiment of system 400. In an example embodiment, system 500 depicts a simulation of a shot in quantum circuit 302. For example, as illustrated in FIG. 5, system 500 depicts a simulation of shot 306a comprising operators 304a, 304b, and 304c, where each operator 304a, 304b, and 304c can be executed as described above (e.g., via processor 106, simulator component 110, etc.) using random sample values 308a, 310a, and 312a, respectively. In this example, as illustrated in FIG. 5, simulation of shot 306a comprising operators 304a, 304b, and 304c using random sample values 308a, 310a, and 312a, respectively, can yield probability distributions 502a, 502b, and 502c, respectively. As depicted in FIG. 5: probability distribution 502a can be 0.0-0.92; probability distribution 502b can be 0.0-0.91; and probability distribution 502c can be 0.0-0.93.

Figure 6:
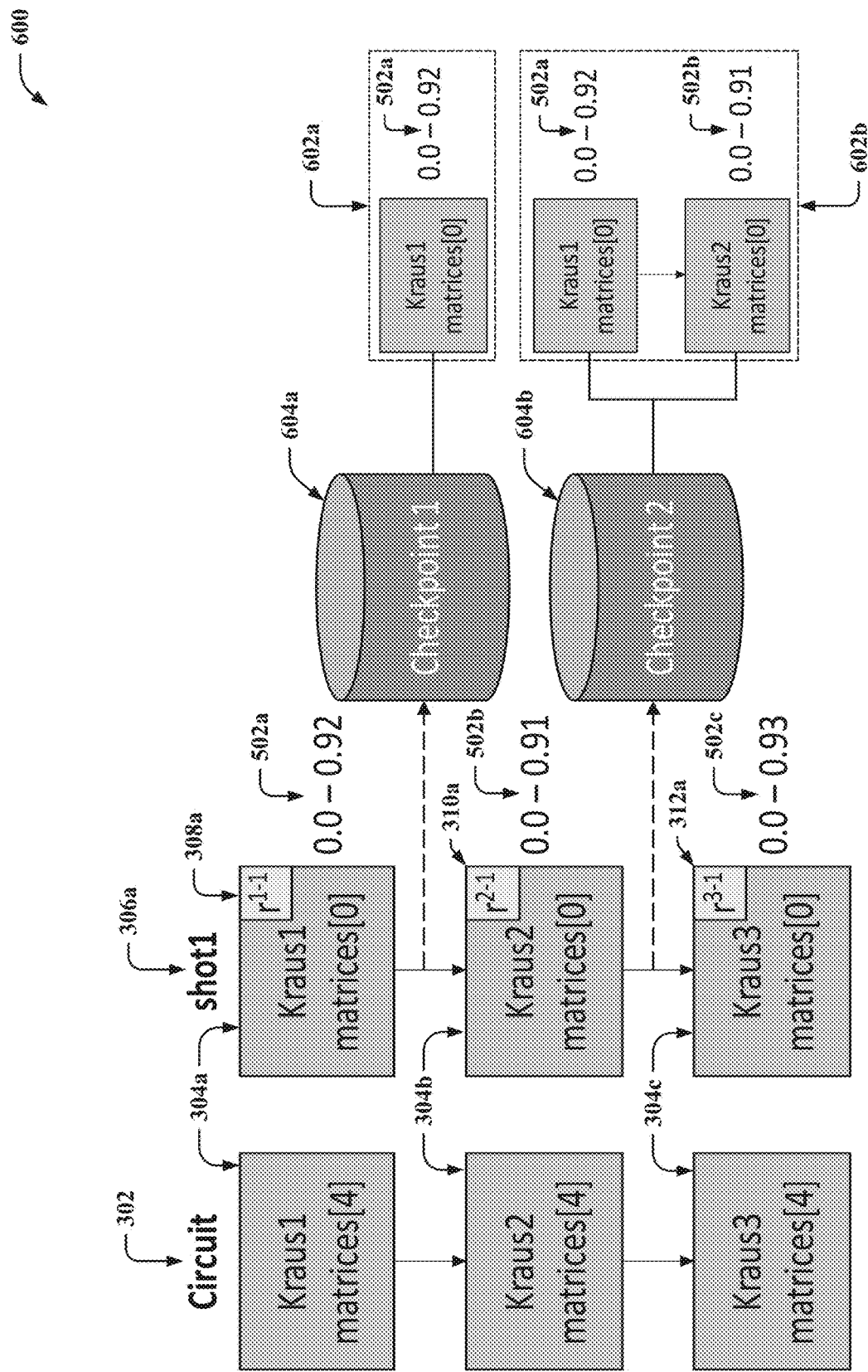

System 600 depicted in FIG. 6 can comprise an example, non-limiting alternative embodiment of system 500. In accordance with multiple embodiments described herein, cache component 108 can cache a probability distribution and a quantum state of one or more operators (e.g., one or more Kraus operators) in a quantum circuit. For example, cache component 108 can comprise a cache memory (e.g., memory 104) that can store one or more probability distributions and one or more quantum states corresponding to one or more operators in one or more shots of a quantum circuit. For instance, based on simulation of an operator in a shot of a quantum circuit, cache component 108 can denote a result yielded from such simulation as a checkpoint and can further store such result data as cached data in a cache memory (e.g., memory 104) as described below.

In the example embodiment illustrated in FIG. 6, based on simulation of operator 304a in shot 306a as described above with reference to FIG. 5, cache component 108 can denote a result 602a yielded from such simulation as a checkpoint 604a (denoted as Checkpoint 1 in FIG. 6), where result 602a can comprise probability distribution 502a and/or a quantum state corresponding to operator 304a. Additionally, or alternatively, in the example embodiment illustrated in FIG. 6, based on simulation of operator 304b in shot 306a as described above with reference to FIG. 5, cache component 108 can denote a result 602b yielded from such simulation as a checkpoint 604b (denoted as Checkpoint 2 in FIG. 6), where result 602b can comprise probability distributions 502a and 502b and/or a quantum state corresponding to operator 304b. As described above, cache component 108 can store result 602a and/or 602b in a cache memory (e.g., memory 104).

Cache component 108 can further associate a probability distribution and/or a quantum state with one or more operators (e.g., one or more Kraus operators). For example, cache component 108 can respectively associate, in a cache memory (e.g., memory 104), one or more operators in a shot of a quantum circuit with one or more probability distributions and one or more quantum states corresponding to such one or more operators. For instance, based on simulation of an operator in a shot of a quantum circuit, cache component 108 can associate, in a cache memory (e.g., memory 104), such an operator with a probability distribution and a quantum state that can be obtained from such simulation (e.g., a probability distribution and a quantum state corresponding to the operator).

In the example embodiment illustrated in FIG. 6, based on simulation of operator 304a in shot 306a as described above with reference to FIG. 5, cache component 108 can associate, in a cache memory (e.g., memory 104), operator 304a with result 602a comprising probability distribution 502a and a quantum state corresponding to operator 304a, where cache component 108 can denote such an association as checkpoint 604a. Additionally, or alternatively, in the example embodiment illustrated in FIG. 6, based on simulation of operator 304b in shot 306a as described above with reference to FIG. 5, cache component 108 can associate, in a cache memory (e.g., memory 104), operator 304b with result 602b comprising probability distributions 502a and 502b and a quantum state corresponding to operator 304b, where cache component 108 can denote such an association as checkpoint 604b.

Figure 7:
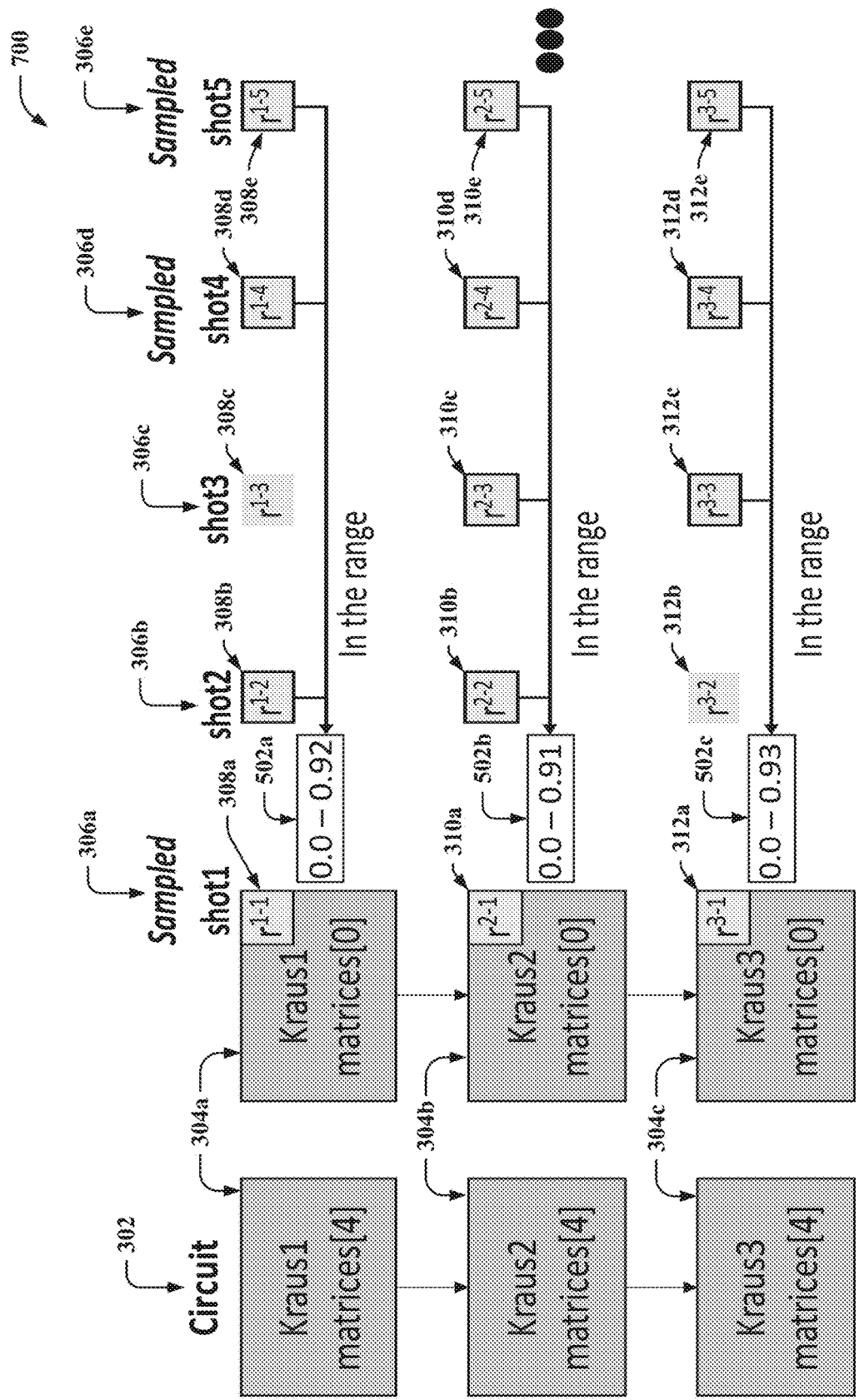

System 700 depicted in FIG. 7 can comprise an example, non-limiting alternative embodiment of system 600. In accordance with multiple embodiments described herein, simulator component 110 can obtain a sample of a shot comprising a defined number of operators (e.g., Kraus operators) having a corresponding random sample value within a probability distribution corresponding respectively to the operators. To obtain such a sample of such a shot, simulator component 110 can determine whether one or more random sample values that can be in the list of random sample values generated and/or sorted by random generator component 202 (e.g., as described above with reference to FIG. 3) are within one or more corresponding probability distributions.

In the example embodiment illustrated in FIG. 7, based on simulation of operators 304a, 304b, and 304c in shot 306a as described above with reference to FIG. 5, simulator component 110 can determine whether one or more random sample values 308a-308n, 310a-310n, or 312a-312n are within one or more corresponding probability distributions 502a, 502b, or 502c. In this example embodiment, based on such determination, simulator component 110 can obtain samples for one or more shots that comprise a defined number of operators (e.g., Kraus operators, not illustrated in FIG. 7) having a corresponding random sample value that is within a corresponding probability distribution 502a, 502b, or 502c. For instance, in this example embodiment, simulator component 110 can obtain samples for shots 306a, 306d, and/or 306e as each operator (e.g., Kraus operator, not illustrated in FIG. 7) in each of such shots can comprise a random sample value that is within corresponding probability distributions 502a, 502b, and 502c, respectively. In the example embodiment illustrated in FIG. 7, shots 306a, 306d, and 306e can comprise sampled shots and shots 306b and 306c can comprise not sampled shots.

Figure 8:
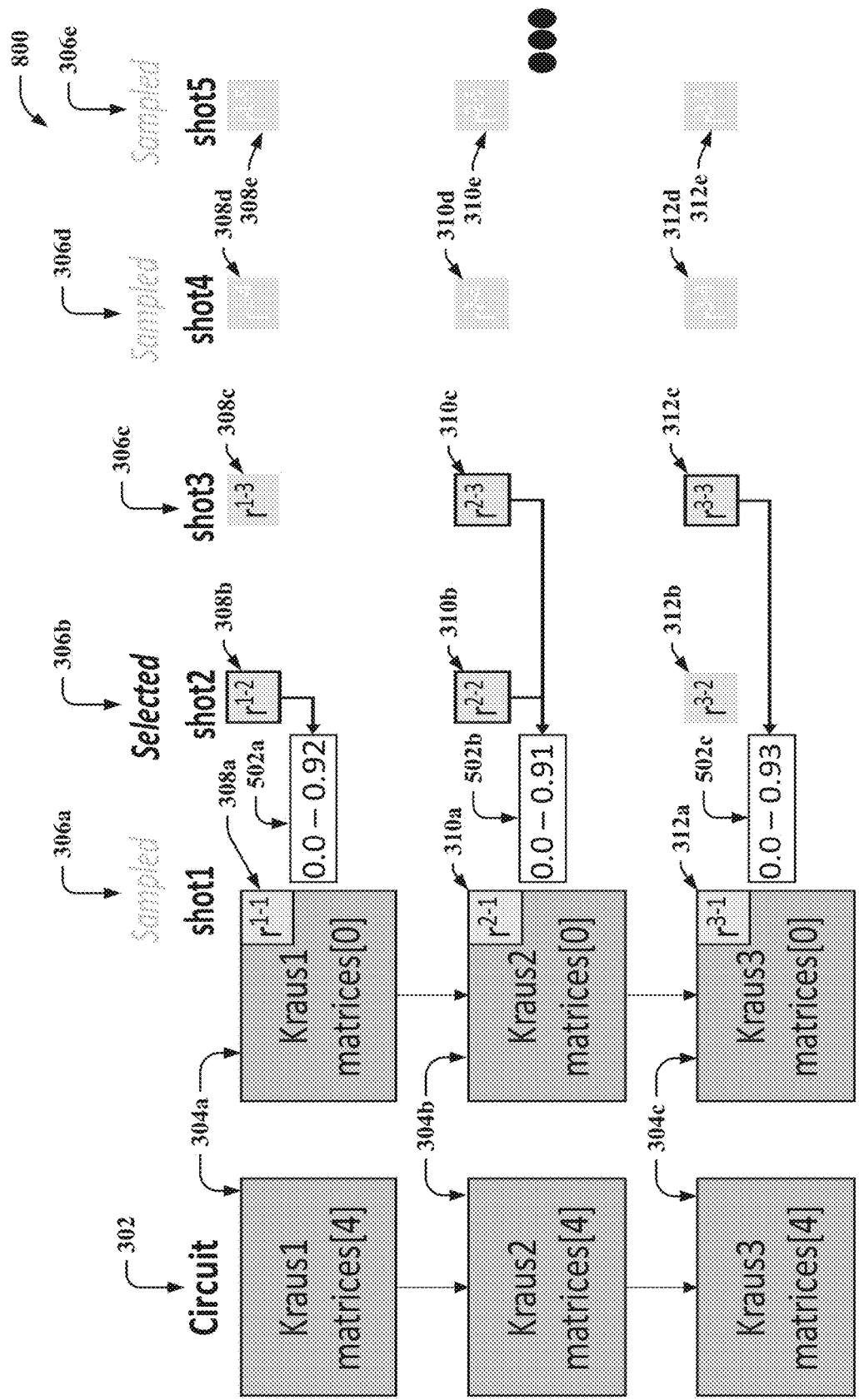

System 800 depicted in FIG. 8 can comprise an example, non-limiting alternative embodiment of system 700. In accordance with multiple embodiments described herein, simulator component 110 can select a not sampled shot comprising a defined number of operators (e.g., one or more Kraus operators) having a corresponding random sample value within one or more probability distributions corresponding to one or more executed operators. For instance, simulator component 110 can select a not sampled shot comprising the most operators (e.g., relative to other shots) having a corresponding random sample value within one or more probability distribution corresponding to one or more executed operators. In the example embodiment illustrated in FIG. 8, simulator component 110 can select a not sampled shot such as, for example, shot 306b comprising one or more operators (e.g., one or more Kraus operators, not illustrated in FIG. 8) having corresponding random sample values 308b and 310b within probability distributions 502a and 502b corresponding to operators 304a and 304b.

Figure 9:
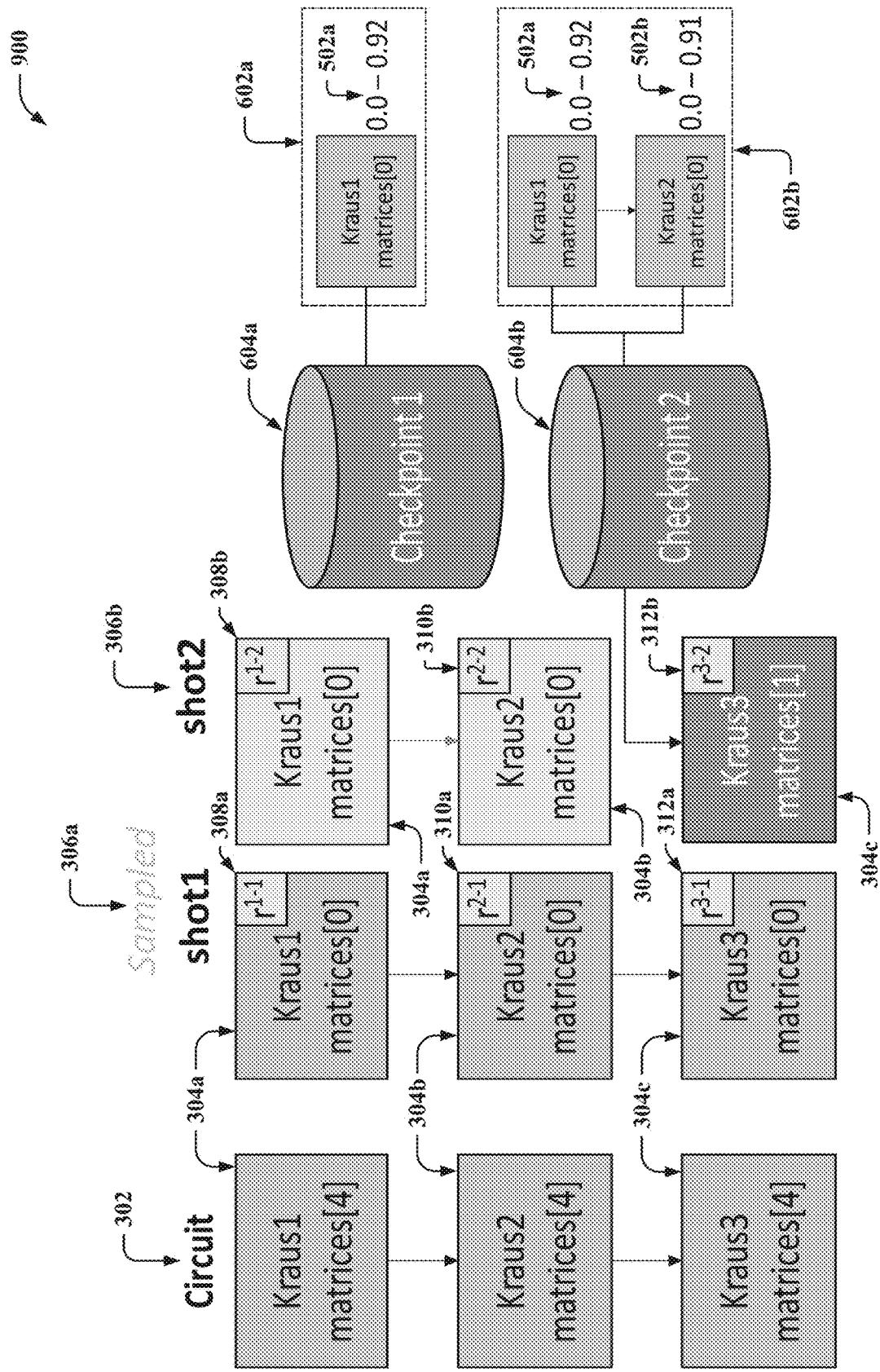

System 900 depicted in FIG. 9 can comprise an example, non-limiting alternative embodiment of system 800. In accordance with multiple embodiments described herein, simulator component 110 can simulate one or more shots of a quantum circuit based on a probability distribution and a quantum state of one or more operators (e.g., one or more Kraus operators), wherein the one or more shots are indicative of one or more algorithm execution instances. In the example embodiment illustrated in FIG. 9, simulator component 110 can simulate shot 306b in quantum circuit 302 based on (e.g., using) result 602b that can be obtained from simulating shot 306a (e.g., via simulator component 110) and that can be cached (e.g., via cache component 108) in a cache memory (e.g., memory 104) as described above with reference to FIGS. 5 and 6. For instance, in the example embodiment illustrated in FIG. 9, simulator component 110 can simulate operator 304c of shot 306b based on (e.g., using) probability distributions 502a and 502b and a quantum state corresponding to operator 304b of shot 306a.

To facilitate such simulation of shot 306b as described above (e.g., simulation of operator 304c of shot 306b using result 602b), simulator component 110 can implement (e.g., via processor 106) script 402 illustrated in FIG. 4 and/or the script below.

Script to Use Cached Probability Distributions and/or Quantum State

```
if (!caches.empty( )) {
    bool hit = true;
    for (int i = 0; i < num_of_kraus; ++i)
        hit &= rands[i] < caches[i];
    if (hit) {
        result[shot++] = get from prob_amplitudes;
        continue;
    }}
initialize prob_amplitudes;
caches.clear( );
```

The example, non-limiting sequence of operations described above with reference to FIGS. 3-9 can be repeated to simulate all shots (e.g., shots 306a, 306b, 306c, 306d, 306e, and/or 306n) of a quantum circuit (e.g., quantum circuit 302). For instance, in some embodiments, operator sampling system 102 (e.g., via processor 106, cache component 108, simulator component 110, and/or random generator component 202) can implement (e.g., execute) the script below to: a) generate a list of random sample values for each shot in advance of simulation; b) sort lists for all the shots; c) obtain a list of random sample values from the sorted lists; d) determine whether each random sample value in the list is lower than a corresponding cached probability distribution; e) if yes, use the final probability amplitudes in the previous shot simulation to simulate a next shot in the quantum circuit; and/or f) if no, run simulation while caching accumulated probability distributions for each operator (e.g., each Kraus operator) in each shot.

Script to Sample Operators in a Quantum Circuit

```
vector<vector<double>> shot2rands;
for (int i = 0; i < shots; ++i) {
    vector<double> rands;
    for (int j = 0; j < num_of_kraus; ++j)
        rands.push_back(rng.next(.0, 1.));
    shot2rands.push_back(rands);
}
sort (shot2rands);
vector<double> caches;
shot = 0;
for (vector<double> rands: shot2rands) {
    if (!caches.empty( )) {
        bool hit = true;
        for (int i = 0; i < num_of_kraus; ++i)
            hit &= rands[i] < caches[i];
        if (hit) {
            result[shot++] = get from prob_amplitudes;
            continue;
        }}
    initialize prob_amplitudes;
    caches.clear( );
    for (gate g: gates in a circuit) {
        if(g is not kraus) {
            update probability_amplitudes with g;
            continue;
        }
        for (auto kmat : g.kmats){
            if(accum += normalize(data, q, vmat) > r) {
                apply_matrix(data, kmat * 1 / sqrt(p));
                caches.push_back(accum);
                break;
            }}}}
```

Operator sampling system 102 can be associated with various technologies. For example, operator sampling system 102 can be associated with quantum computing technologies, quantum hardware and/or software technologies, quantum algorithm technologies, quantum simulation technologies, quantum operator sampling technologies, machine learning technologies, artificial intelligence technologies, cloud computing technologies, and/or other technologies.

Operator sampling system 102 can provide technical improvements to systems, devices, components, operational steps, and/or processing steps associated with the various technologies identified above. For example, operator sampling system 102 can: cache a probability distribution and a quantum state of one or more Kraus operators in a quantum circuit; and/or simulate one or more shots of the quantum circuit based on the probability distribution and the quantum state of the one or more Kraus operators, wherein the one or more shots are indicative of one or more algorithm execution instances. For instance, operator sampling system 102 (e.g., via cache component 108, simulator component 110, and/or random generator component 202) can simulate at least one shot of the quantum circuit based on one or more probability distributions and one or more quantum states of at least one Kraus operator in the quantum circuit. In this example, by simulating at least one shot of the quantum circuit based on one or more probability distributions and one or more quantum states of at least one Kraus operator in the quantum circuit, operator sampling system 102 can reduce the number of shots executed in a simulation of the quantum circuit. In this example, by reducing the number of shots executed in a simulation of the quantum circuit, operator sampling system 102 can facilitate at least one of reduced computational costs or improved performance of at least one of a system (e.g., a quantum simulation system) or a processor (e.g., processor 106, a quantum processor, etc.) that performs such simulation.

Operator sampling system 102 can provide technical improvements to a processing unit (e.g., processor 106, a quantum processor, etc.) associated with a classical computing device and/or a quantum computing device (e.g., a quantum processor, quantum hardware, superconducting circuit, etc.) associated with operator sampling system 102. For example, as described above, by simulating at least one shot of the quantum circuit based on one or more probability distributions and one or more quantum states of at least one Kraus operator in the quantum circuit, operator sampling system 102 can reduce the number of shots executed in a simulation of the quantum circuit. In this example, by reducing the number of shots executed in a simulation of the quantum circuit, operator sampling system 102 can facilitate at least one of reduced computational costs or improved performance of a processor (e.g., processor 106, a quantum processor, etc.) that performs such simulation.

Based on such reduced number of shots executed in a simulation of a quantum circuit as described above, a practical application of operator sampling system 102 is that it can be implemented to compute one or more solutions (e.g., heuristic(s), etc.) to a variety of problems ranging in complexity (e.g., an estimation problem, an optimization problem, etc.) in a variety of domains (e.g., finance, chemistry, medicine, etc.). For example, based on such reduced number of shots executed in a simulation of a quantum circuit as described above, a practical application of operator sampling system 102 is that it can be implemented using, for instance, a classical computer (e.g., general-purpose computer) to compute one or more solutions (e.g., heuristic(s), etc.) to an optimization problem in the domain of chemistry and/or medicine, where such a solution can be used to engineer, for instance, a new chemical compound and/or a new medication.

It should be appreciated that operator sampling system 102 provides a new approach driven by relatively new quantum computing technologies. For example, operator sampling system 102 provides a new approach to reduce the number of shots executed in a simulation of a quantum circuit, which can enable efficient simulation of the quantum circuit using, for instance, a classical computer (e.g., a general-purpose computer).

Operator sampling system 102 can employ hardware or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, etc.) to execute defined tasks related to the various technologies identified above. Operator sampling system 102 and/or components thereof, can be employed to solve new problems that arise through advancements in technologies mentioned above, employment of quantum computing systems, cloud computing systems, computer architecture, and/or another technology.

It is to be appreciated that operator sampling system 102 can utilize various combinations of electrical components, mechanical components, and circuitry that cannot be replicated in the mind of a human or performed by a human, as the various operations that can be executed by operator sampling system 102 and/or components thereof as described herein are operations that are greater than the capability of a human mind. For instance, the amount of data processed, the speed of processing such data, or the types of data processed by operator sampling system 102 over a certain period of time can be greater, faster, or different than the amount, speed, or data type that can be processed by a human mind over the same period of time.

According to several embodiments, operator sampling system 102 can also be fully operational towards performing one or more other functions (e.g., fully powered on, fully executed, etc.) while also performing the various operations described herein. It should be appreciated that such simultaneous multi-operational execution is beyond the capability of a human mind. It should also be appreciated that operator sampling system 102 can include information that is impossible to obtain manually by an entity, such as a human user. For example, the type, amount, and/or variety of information included in operator sampling system 102, cache component 108, simulator component 110, and/or random generator component 202 can be more complex than information obtained manually by a human user.

Figure 10:
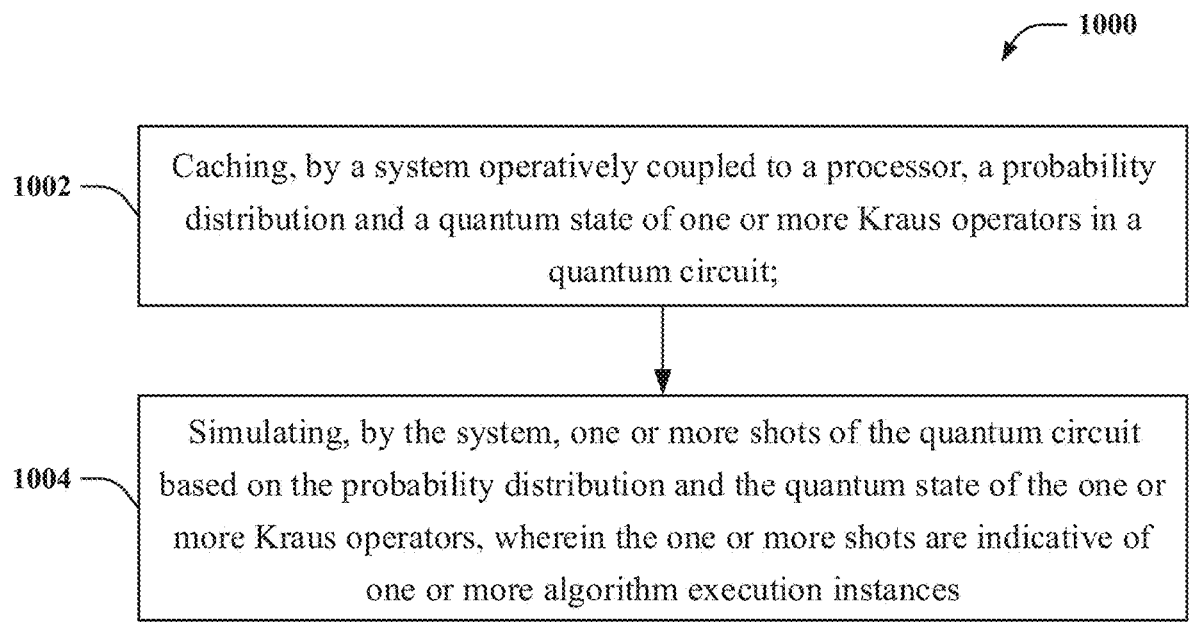
FIGS. 10-11 illustrate flow diagrams of example, non-limiting computer-implemented methods that can facilitate sampling of an operator in a quantum system in accordance with one or more embodiments described herein.

FIG. 10 illustrates a flow diagram of an example, non-limiting computer-implemented method 1000 that can facilitate sampling of an operator in a quantum system in accordance with one or more embodiments described herein. Repetitive description of like elements and/or processes employed in respective embodiments is omitted for sake of brevity.

At 1002, computer-implemented method 1000 can comprise caching, by a system (e.g., via operator sampling system 102 and/or cache component 108) operatively coupled to a processor (e.g., processor 106, a quantum processor, etc.), a probability distribution (e.g., probability distributions 502a, 502b, and/or 502c) and a quantum state of one or more Kraus operators (e.g., operators 304a, 304b, and/or 304c) in a quantum circuit (e.g., quantum circuit 302).

At 1004, computer-implemented method 1000 can comprise simulating, by the system (e.g., via operator sampling system 102 and/or simulator component 110), one or more shots (e.g., shot 306b and/or operator 304c of shot 306b) of the quantum circuit based on the probability distribution and the quantum state of the one or more Kraus operators, wherein the one or more shots are indicative of one or more algorithm execution instances. For example, in the example embodiment illustrated in FIG. 9, simulator component 110 can simulate shot 306b in quantum circuit 302 based on (e.g., using) result 602b that can be obtained from simulating shot 306a (e.g., via simulator component 110) and that can be cached (e.g., via cache component 108) in a cache memory (e.g., memory 104) as described above with reference to FIGS. 5 and 6. For instance, in the example embodiment illustrated in FIG. 9, simulator component 110 can simulate operator 304c of shot 306b based on (e.g., using) probability distributions 502a and 502b and a quantum state corresponding to operator 304b of shot 306a.

Figure 11:
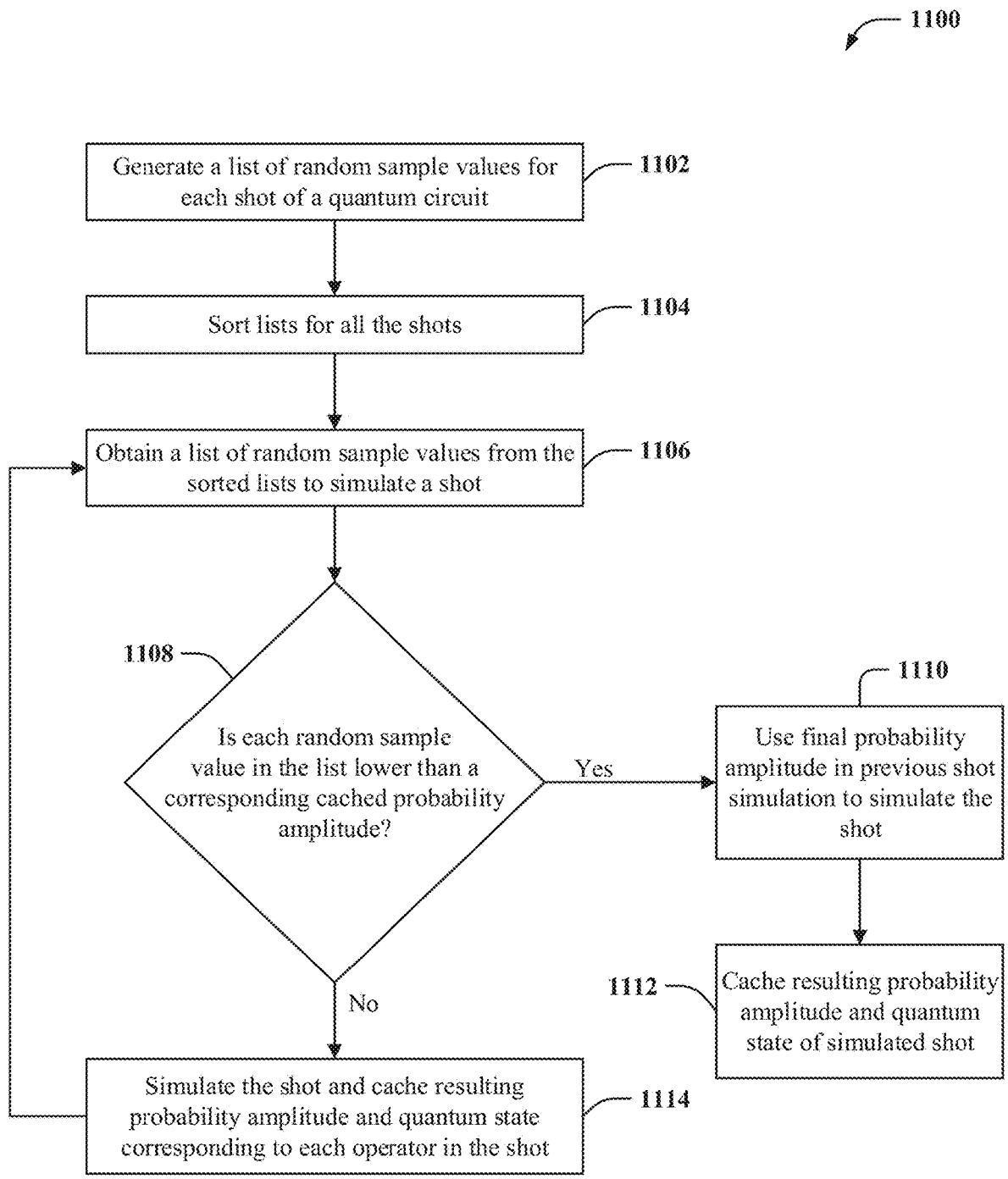

FIG. 11 illustrates a flow diagram of an example, non-limiting computer-implemented method 1100 that can facilitate sampling of an operator in a quantum system in accordance with one or more embodiments described herein. Repetitive description of like elements and/or processes employed in respective embodiments is omitted for sake of brevity.

At 1102, computer-implemented method 1100 can comprise generating (e.g., via operator sampling system 102 and/or random generator component 202) a list of random sample values (e.g., random sample values 308a-308n, 310a-310n, and/or 312a-312n) for each shot (e.g., shots 306a, 306b, 306c, 306d, 306e, and/or 306n) of a quantum circuit (e.g., quantum circuit 302). For example, as described above with reference to FIG. 3, to generate such a list of random sample values, random generator component 202 can implement (e.g., execute via processor 106) the script defined below.

| Script to Generate Random Sample Values |
|---|
| vector<vector<double>> shot2rands;<br>for (int i = 0; i < shots; ++i) {<br>    vector<double> rands;<br>    for (int j = 0; j < num_of_kraus; ++j)<br>        rands.push_back(rng.next(.0, 1.));<br>    shot2rands.push_back(rands);<br>} |

At 1104, computer-implemented method 1100 can comprise sorting (e.g., via operator sampling system 102 and/or random generator component 202) lists for all the shots. For example, as described above with reference to FIG. 3, to sort such lists for all the shots, random generator component 202 can implement (e.g., execute via processor 106) the script defined below.

| Script to Sort Lists for All Shots |
|---|
| sort (shot2rands); |

At 1106, computer-implemented method 1100 can comprise obtaining (e.g., via operator sampling system 102 and/or simulator component 110) a list of random sample values from the sorted lists to simulate a shot (e.g., to simulate one or more of shots 306a, 306b, 306c, 306d, 306e, and/or 306n using simulator component 110). For example, as described above with reference to FIG. 4, to obtain such a list of random sample values from the sorted lists, random generator component 202 can implement (e.g., execute via processor 106) the script defined below.

| Script to Obtain a List of Random Sample Values |
|---|
| vector<double> caches;<br>shot = 0;<br>for (vector<double> rands: shot2rands) { |

At 1108, computer-implemented method 1100 can comprise determining (e.g., via operator sampling system 102 and/or simulator component 110) whether each random sample value in the list is lower than a corresponding cached probability amplitude (also referred to herein as probability distribution or probability range). For example, at 1108, computer-implemented method 1100 can comprise determining (e.g., via simulator component 110) whether each random sample value is within a corresponding cached probability amplitude (e.g., probability distributions 502a, 502b, and/or 502c obtained from a previous shot simulation by simulator component 110 and cached in a cache memory (e.g., memory 104) by cache component 108 as described above with reference to FIGS. 4-6). In an example embodiment, to determine whether each random sample value in the list is lower than a corresponding cached probability amplitude (e.g., within a cached probability distribution), simulator component 110 can implement (e.g., execute via processor 106) the script defined below.

| Script to Determine if Values Are<br>in a Cached Probability Amplitude |
|---|
| if (!caches.empty( )) {<br>    bool hit = true;<br>    for (int i = 0; i < num_of_kraus; ++i)<br>        hit &= rands[i] < caches[i];<br>    if (hit) {<br>        result[shot++] = get from prob_amplitudes;<br>        continue;<br>}}<br>initialize prob_amplitudes;<br>caches.clear( ); |

If it is determined at 1108 that each random sample value in the list is lower than a corresponding cached probability amplitude, at 1110, computer-implemented method 1100 can comprise using (e.g., via operator sampling system 102 and/or simulator component 110) a final probability amplitude (e.g., result 602b comprising probability distributions 502a and 502b) in a previous shot simulation (e.g., a simulation of shot 306a) to simulate the shot (e.g., to simulate shot 306b). For example, as described above with reference to FIGS. 3-9, to simulate a shot using a final probability amplitude obtained from a previous shot simulation, random generator component 202 can implement (e.g., execute via processor 106) script 402 illustrated in FIG. 4 and/or the script defined below.

| Script to Use Cached Probability Distributions and/or Quantum State |
|---|
| ```
if (!caches.empty( )) {
    bool hit = true;
    for (int i = 0; i < num_of_kraus; ++i)
        hit &= rands[i] < caches[i];
    if (hit) {
        result[shot++] = get from prob_amplitudes;
        continue;
}}
initialize prob_amplitudes;
caches.clear( );
``` |

At 1112, computer-implemented method 1100 can comprise caching (e.g., via operator sampling system 102 and/or cache component 108) resulting probability amplitude and quantum state of simulated shot. For example, with reference to FIG. 9, based on simulation of shot 306$b$ (e.g., simulation of operator 304$c$ in shot 306$b$) using result 602$b$ comprising probability distributions 502$a$ and 502$b$ and a corresponding quantum state, cache component 108 can cache, in a cache memory (e.g., memory 104), a resulting probability amplitude and a quantum state yielded by operator 304$c$ in simulated shot 306$b$.

If it is determined at 1108 that at least one random sample value in the list is not lower than a corresponding cached probability amplitude, at 1114, computer-implemented method 1100 can comprise simulating (e.g., via operator sampling system 102 and/or simulator component 110) the shot (e.g., shot 306$c$) and caching (e.g., via operator sampling system 102 and/or cache component 108) a resulting probability amplitude and a quantum state corresponding to each operator (e.g., operators 304$a$, 304$b$, and 304$c$) in the shot (e.g., shot 306$c$). To facilitate such simulation and/or caching described above, simulator component 110 and/or cache component 108, respectively, can implement (e.g., execute via processor 106) the script defined below. Additionally, or alternatively, in some embodiments, cache component 108 can cache such resulting probability amplitude and such quantum state in a cache memory (e.g., memory 104).

| Script to Simulate a Shot and/or Cache Results of Each Operator |
|---|
| ```
for (gate g: gates in a circuit) {
    if(g is not kraus) {
        update probability_amplitudes with g;
        continue;
    }
    for (auto kmat : g.kmats){
        if(accum += normalize(data, q, vmat) > r) {
            apply_matrix(data, kmat * 1 / sqrt(p));
            caches.push_back(accum);
            break;
}}}}
``` |

Based on such simulation and/or caching described above at 1114, computer-implemented method 1100 can return to 1106 to facilitate simulation of another shot in a quantum circuit. In some embodiments, operations 1106, 1108, and 1114 and/or operations 1106, 1108, 1110, and 1112 can be repeated until all shots in the quantum circuit have been simulated.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 12:
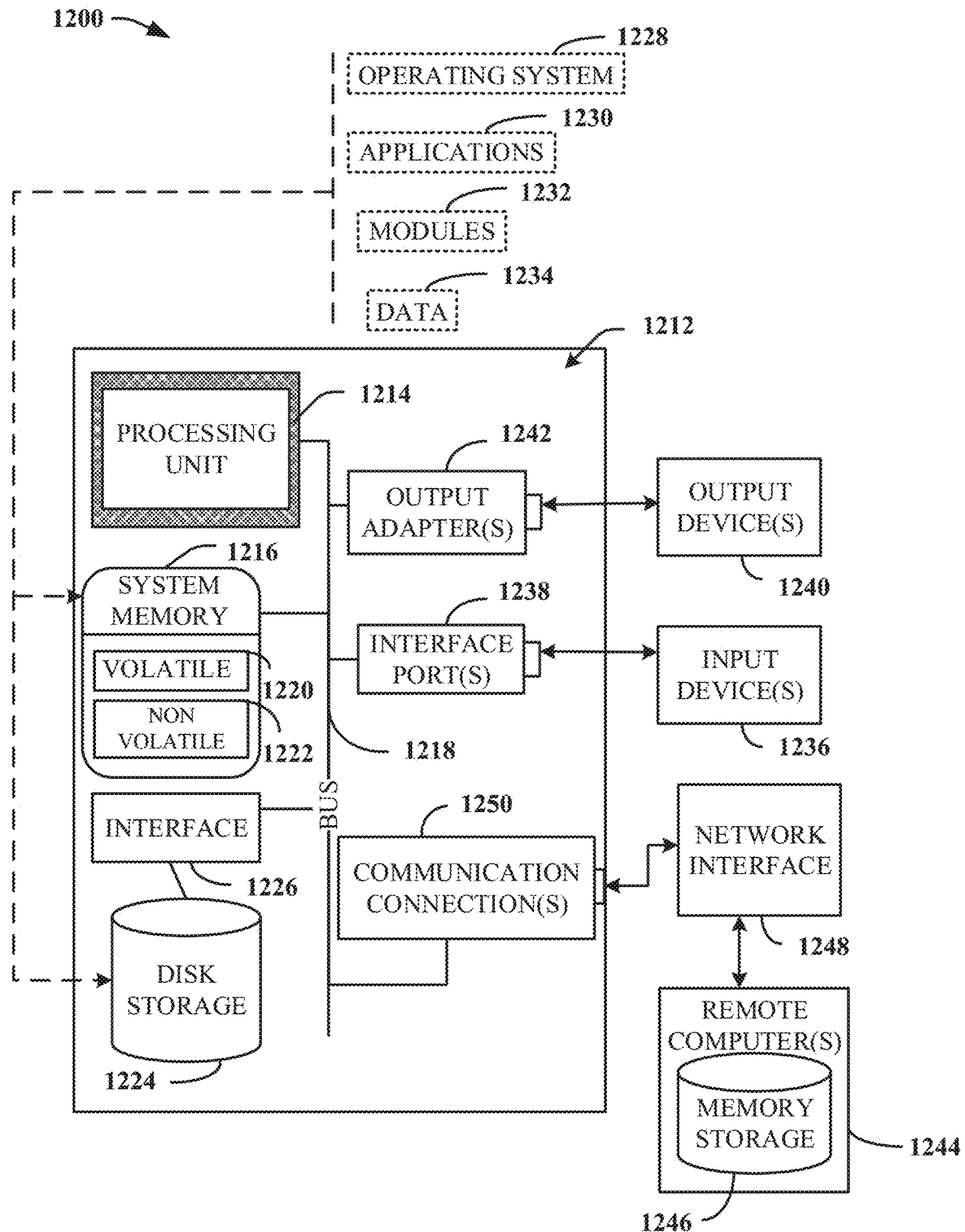
FIG. 12 illustrates a block diagram of an example, non-limiting operating environment in which one or more embodiments described herein can be facilitated.

In order to provide a context for the various aspects of the disclosed subject matter, FIG. 12 as well as the following discussion are intended to provide a general description of a suitable environment in which the various aspects of the disclosed subject matter can be implemented. FIG. 12 illustrates a block diagram of an example, non-limiting operating environment in which one or more embodiments described herein can be facilitated. Repetitive description of like elements employed in other embodiments described herein is omitted for sake of brevity.

With reference to FIG. 12, a suitable operating environment 1200 for implementing various aspects of this disclosure can also include a computer 1212. The computer 1212 can also include a processing unit 1214, a system memory 1216, and a system bus 1218. The system bus 1218 couples system components including, but not limited to, the system memory 1216 to the processing unit 1214. The processing unit 1214 can be any of various available processors. Dual microprocessors and other multiprocessor architectures also can be employed as the processing unit 1214. The system bus 1218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1216 can also include volatile memory 1220 and nonvolatile memory 1222. The basic input/output system (BIOS), containing the basic routines to transfer information between elements within the computer 1212, such as during start-up, is stored in nonvolatile memory 1222. Computer 1212 can also include removable/non-removable, volatile/non-volatile computer storage media. FIG. 12 illustrates, for example, a disk storage 1224. Disk storage 1224 can also include, but is not limited to, devices like a magnetic disk drive, floppy disk drive, tape drive, Jaz drive, Zip drive, LS-100 drive, flash memory card, or memory stick. The disk storage 1224 also can include storage media separately or in combination with other storage media. To facilitate connection of the disk storage 1224 to the system bus 1218, a removable or non-removable interface is typically used, such as interface 1226. FIG. 12 also depicts software that acts as an intermediary between users and the basic computer resources described in the suitable operating environment 1200. Such software can also include, for example, an operating system 1228. Operating system 1228, which can be stored on disk storage 1224, acts to control and allocate resources of the computer 1212.

System applications 1230 take advantage of the management of resources by operating system 1228 through program modules 1232 and program data 1234, e.g., stored either in system memory 1216 or on disk storage 1224. It is to be appreciated that this disclosure can be implemented with various operating systems or combinations of operating systems. A user enters commands or information into the computer 1212 through input device(s) 1236. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1214 through the system bus 1218 via interface port(s) 1238. Interface port(s) 1238 include, for example, a serial port, a parallel port, a game port, and a universal serial bus (USB). Output device(s) 1240 use some of the same type of ports as input device(s) 1236. Thus, for example, a USB port can be used to provide input to computer 1212, and to output information from computer 1212 to an output device 1240. Output adapter 1242 is provided to illustrate that there are some output devices 1240 like monitors, speakers, and printers, among other output devices 1240, which require special adapters. The output adapters 1242 include, by way of illustration and not limitation, video and sound cards that provide a means of connection between the output device 1240 and the system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. The remote computer(s) 1244 can be a computer, a server, a router, a network PC, a workstation, a microprocessor based appliance, a peer device or other common network node and the like, and typically can also include many or all of the elements described relative to computer 1212. For purposes of brevity, only a memory storage device 1246 is illustrated with remote computer(s) 1244. Remote computer(s) 1244 is logically connected to computer 1212 through a network interface 1248 and then physically connected via communication connection 1250. Network interface 1248 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1250 refers to the hardware/software employed to connect the network interface 1248 to the system bus 1218. While communication connection 1250 is shown for illustrative clarity inside computer 1212, it can also be external to computer 1212. The hardware/software for connection to the network interface 1248 can also include, for exemplary purposes only, internal and external technologies such as, modems including regular telephone grade modems, cable modems and DSL modems, ISDN adapters, and Ethernet cards.

Figure 13:
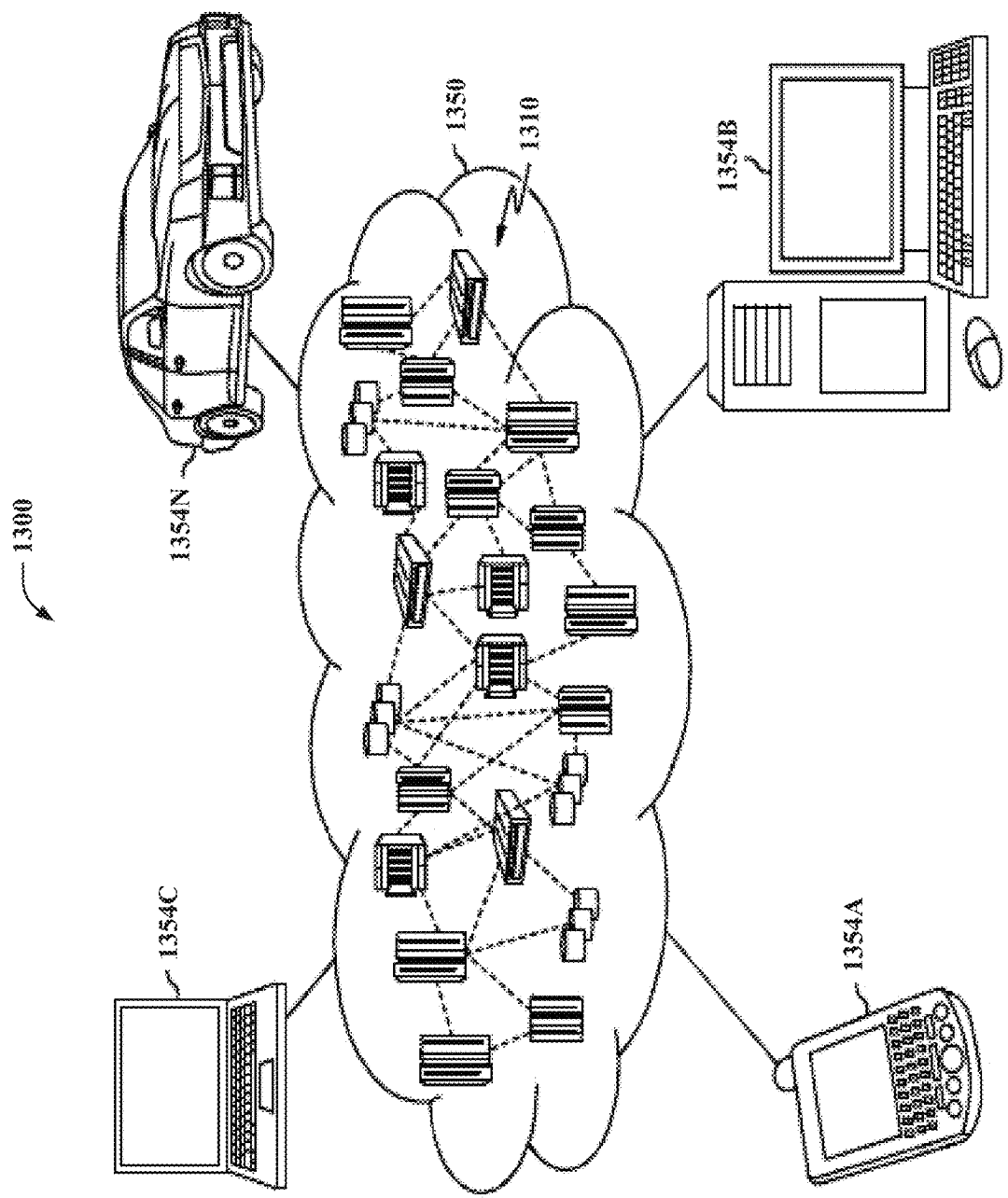
FIG. 13 illustrates a block diagram of an example, non-limiting cloud computing environment in accordance with one or more embodiments of the subject disclosure.

Referring now to FIG. 13, an illustrative cloud computing environment 1350 is depicted. As shown, cloud computing environment 1350 includes one or more cloud computing nodes 1310 with which local computing devices used by cloud consumers, such as, for example, personal digital assistant (PDA) or cellular telephone 1354A, desktop computer 1354B, laptop computer 1354C, and/or automobile computer system 1354N may communicate. Although not illustrated in FIG. 13, cloud computing nodes 1310 can further comprise a quantum platform (e.g., quantum computer, quantum hardware, quantum software, etc.) with which local computing devices used by cloud consumers can communicate. Nodes 1310 may communicate with one another. They may be grouped (not shown) physically or virtually, in one or more networks, such as Private, Community, Public, or Hybrid clouds as described hereinabove, or a combination thereof. This allows cloud computing environment 1350 to offer infrastructure, platforms and/or software as services for which a cloud consumer does not need to maintain resources on a local computing device. It is understood that the types of computing devices 1354A-N shown in FIG. 13 are intended to be illustrative only and that computing nodes 1310 and cloud computing environment 1350 can communicate with any type of computerized device over any type of network and/or network addressable connection (e.g., using a web browser).

Figure 14:
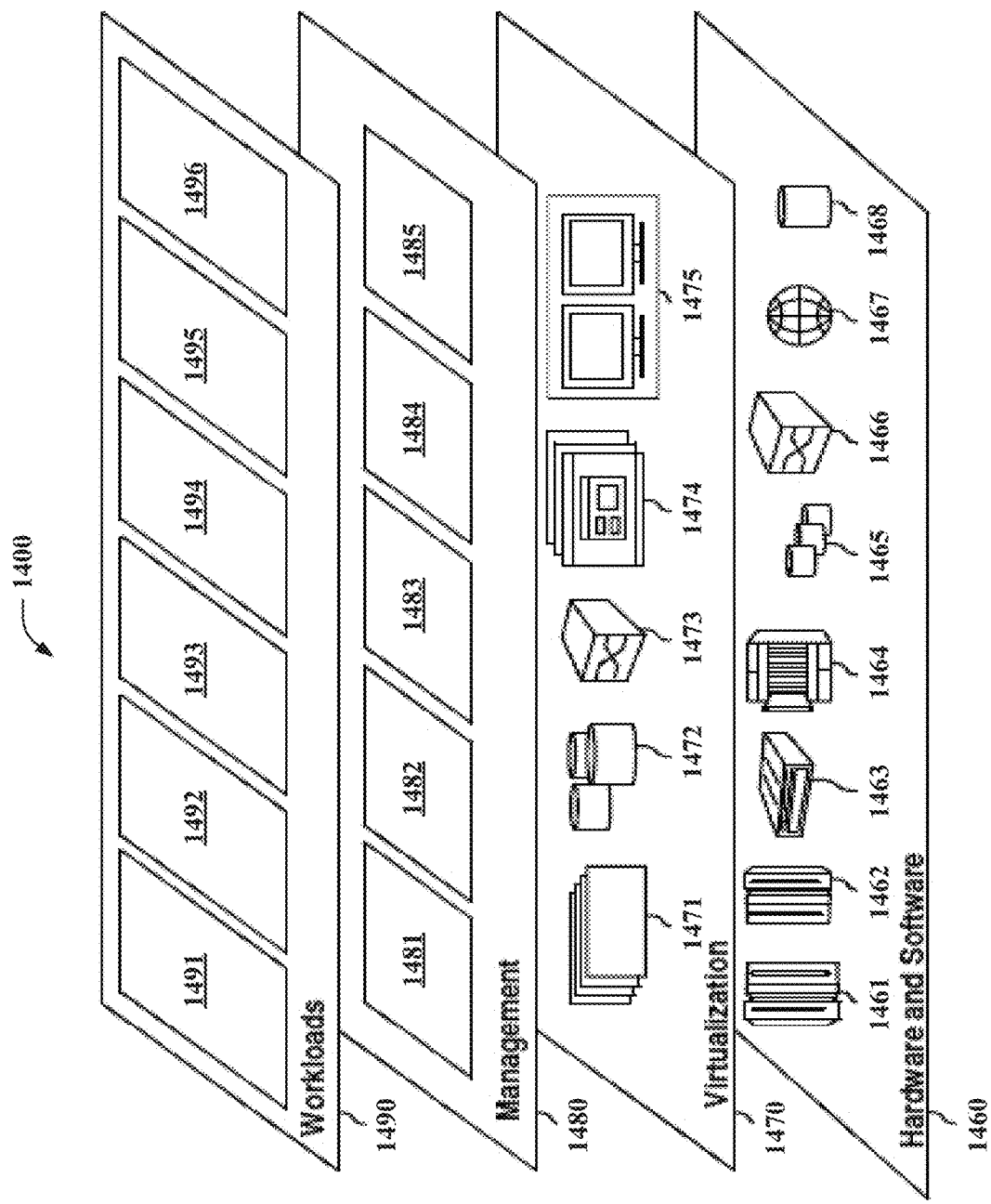
FIG. 14 illustrates a block diagram of example, non-limiting abstraction model layers in accordance with one or more embodiments of the subject disclosure.

Referring now to FIG. 14, a set of functional abstraction layers provided by cloud computing environment 1350 (FIG. 13) is shown. It should be understood in advance that the components, layers, and functions shown in FIG. 14 are intended to be illustrative only and embodiments of the invention are not limited thereto. As depicted, the following layers and corresponding functions are provided:

Hardware and software layer 1460 includes hardware and software components. Examples of hardware components include: mainframes 1461; RISC (Reduced Instruction Set Computer) architecture based servers 1462; servers 1463; blade servers 1464; storage devices 1465; and networks and networking components 1466. In some embodiments, software components include network application server software 1467, database software 1468, quantum platform routing software (not illustrated in FIG. 14), and/or quantum software (not illustrated in FIG. 14).

Virtualization layer 1470 provides an abstraction layer from which the following examples of virtual entities may be provided: virtual servers 1471; virtual storage 1472; virtual networks 1473, including virtual private networks; virtual applications and operating systems 1474; and virtual clients 1475.

In one example, management layer 1480 may provide the functions described below. Resource provisioning 1481 provides dynamic procurement of computing resources and other resources that are utilized to perform tasks within the cloud computing environment. Metering and Pricing 1482 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1483 provides access to the cloud computing environment for consumers and system administrators. Service level management 1484 provides cloud computing resource allocation and management such that required service levels are met. Service Level Agreement (SLA) planning and fulfillment 1485 provide pre-arrangement for, and procurement of, cloud computing resources for which a future requirement is anticipated in accordance with an SLA.

Workloads layer 1490 provides examples of functionality for which the cloud computing environment may be utilized. Non-limiting examples of workloads and functions which may be provided from this layer include: mapping and navigation 1491; software development and lifecycle management 1492; virtual classroom education delivery 1493; data analytics processing 1494; transaction processing 1495; and operator sampling software 1496.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a memory that stores computer executable components; and
   a processor that executes the computer executable components stored in the memory, wherein the computer executable components comprise:
   a cache component that caches a probability distribution and a quantum state of one or more Kraus operators in a quantum circuit; and
   a simulator component that simulates one or more shots of the quantum circuit based on the probability distribution and the quantum state of the one or more Kraus operators, wherein the one or more shots are indicative of one or more algorithm execution instances, wherein the one or more shots comprise at least one not sampled shot comprising a defined number of Kraus operators having a corresponding random sample value within the probability distribution.

2. The system of claim 1, wherein the computer executable components further comprise:
   a random generator component that generates at least one random sample value corresponding to the one or more Kraus operators in the one or more shots of the quantum circuit.

3. The system of claim 1, wherein the simulator component simulates at least one shot of the quantum circuit based on at least one random sample value corresponding to the one or more Kraus operators to obtain the probability distribution and the quantum state.

4. The system of claim 1, wherein the cache component associates at least one of the probability distribution or the quantum state with the one or more Kraus operators.

5. The system of claim 1, wherein the simulator component obtains a sample of a shot comprising a defined number of Kraus operators having a corresponding random sample value within the probability distribution.

6. The system of claim 1, wherein the simulator component simulates at least one shot of the quantum circuit based on one or more probability distributions and one or more quantum states of at least one Kraus operator in the quantum circuit to reduce a number of shots executed in a simulation of the quantum circuit, thereby facilitating at least one of reduced computational costs or improved performance of at least one of the simulator component, the processor, or the system.

7. A computer-implemented method, comprising:
   caching, by a system operatively coupled to a processor, a probability distribution and a quantum state of one or more Kraus operators in a quantum circuit; and
   simulating, by the system, one or more shots of the quantum circuit based on the probability distribution and the quantum state of the one or more Kraus operators, wherein the one or more shots are indicative of one or more algorithm execution instances, wherein the one or more shots comprise at least one not sampled shot comprising a defined number of Kraus operators having a corresponding random sample value within the probability distribution.

8. The computer-implemented method of claim 7, further comprising:
   generating, by the system, at least one random sample value corresponding to the one or more Kraus operators in the one or more shots of the quantum circuit.

9. The computer-implemented method of claim 7, further comprising:
   simulating, by the system, at least one shot of the quantum circuit based on at least one random sample value corresponding to the one or more Kraus operators to obtain the probability distribution and the quantum state.

10. The computer-implemented method of claim 7, wherein the caching further comprises:
    associating, by the system, at least one of the probability distribution or the quantum state with the one or more Kraus operators.

11. The computer-implemented method of claim 7, wherein the one or more shots comprise at least one not sampled shot comprising a defined number of Kraus operators having a corresponding random sample value within the probability distribution.

12. The computer-implemented method of claim 7, further comprising:
    simulating, by the system, at least one shot of the quantum circuit based on one or more probability distributions and one or more quantum states of at least one Kraus operator in the quantum circuit to reduce a number of shots executed in a simulation of the quantum circuit, thereby facilitating at least one of reduced computational costs or improved performance of at least one of the processor or the system.

13. A computer program product facilitating a sampling process of an operator in a quantum system, the computer program product comprising a computer readable storage medium having program instructions embodied therewith, the program instructions executable by a processor to cause the processor to:

cache, by the processor, a probability distribution and a quantum state of one or more Kraus operators in a quantum circuit; and simulate, by the processor, one or more shots of the quantum circuit based on the probability distribution and the quantum state of the one or more Kraus operators, wherein the one or more shots are indicative of one or more algorithm execution instances, wherein the one or more shots comprise at least one not sampled shot comprising a defined number of Kraus operators having a corresponding random sample value within the probability distribution.

14. The computer program product of claim 13, wherein the program instructions are further executable by the processor to cause the processor to:

generate, by the processor, at least one random sample value corresponding to the one or more Kraus operators in the one or more shots of the quantum circuit.

15. The computer program product of claim 13, wherein the program instructions are further executable by the processor to cause the processor to:

simulate, by the processor, at least one shot of the quantum circuit based on at least one random sample value corresponding to the one or more Kraus operators to obtain the probability distribution and the quantum state.

16. The computer program product of claim 13, wherein the program instructions are further executable by the processor to cause the processor to:

associate, by the processor, at least one of the probability distribution or the quantum state with the one or more Kraus operators.

17. The computer program product of claim 13, wherein the program instructions are further executable by the processor to cause the processor to:

obtain, by the processor, a sample of a shot comprising a defined number of Kraus operators having a corresponding random sample value within the probability distribution.

\* \* \* \* \*